United States Patent
Budak et al.

(10) Patent No.: US 7,268,663 B2
(45) Date of Patent: Sep. 11, 2007

(54) PRECISION THIN FILM AC VOLTAGE DIVIDER

(75) Inventors: Sylvia J. Budak, Windsor, CO (US); Joe E. Marriott, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 60 days.

(21) Appl. No.: 11/257,670

(22) Filed: Oct. 25, 2005

(65) Prior Publication Data

US 2006/0119341 A1   Jun. 8, 2006

Related U.S. Application Data

(62) Division of application No. 10/684,101, filed on Oct. 10, 2003, now Pat. No. 7,079,004.

(51) Int. Cl.
*H01C 10/16* (2006.01)
*H01C 13/02* (2006.01)

(52) U.S. Cl. .................. 338/48; 338/319; 338/295; 216/16; 360/319

(58) Field of Classification Search .............. 338/48, 338/195, 239, 260, 295, 308–309, 319–320; 360/319; 216/16, 49; 257/E21.534
See application file for complete search history.

(56) References Cited

U.S. PATENT DOCUMENTS 5,041,191 A * 8/1991 Watson .................. 338/308
6,344,952 B1 * 2/2002 Biskeborn et al. .......... 360/319

* cited by examiner

*Primary Examiner*—K. Richard Lee

(57) ABSTRACT

A precision AC input voltage divider of input resistance $R_I$ and feedback resistance $R_F$ on a substrate is printed as a serpentine pattern for a thin line of resistive material. The input resistance is formed between a first and second terminal, and feedback resistance is formed between the second terminal and a third terminal. A first metallic conductor is formed on the substrate, connected to the first terminal, disposed to be adjacent to the input resistance, and having a distributed capacitive coupling to the input resistance that compensates for corresponding distributed stray capacitance from the input resistance to a circuit ground. A second metallic conductor is formed on the substrate, connected to the third terminal, disposed to be adjacent the feedback resistance, and having a distributed capacitive coupling to the feedback resistance that compensates for corresponding distributed stray capacitance from the feedback resistance to the circuit ground.

2 Claims, 4 Drawing Sheets

PRECISION THIN FILM AC VOLTAGE DIVIDER

REFERENCE TO RELATED APPLICATION

This is a division of an earlier filed application Ser. No. 10/684,101, issued as U.S. Pat. No. 7,079,004, entitled PRECISION THIN FILM AC VOLTAGE DIVIDER filed 10 Oct. 2003 by Sylvia J. Budak and Joe E. Marriott and assigned to Agilent Technologies, Inc.

BACKGROUND OF THE INVENTION

Digital multimeters (DMMS) and various other items of electronic test equipment typically have an internal Analog to Digital Converter (ADC) whose native voltage range is small compared to the overall range of use expected for the DMM. That is, the ADC may have a current driven virtual ground that produces a full scale output with a one hundred millivolt, one volt, or perhaps ten volt input. Modern DMMs generally use a resistive input network to produce from the applied voltage an input current that is within the range of the ADC.

This resistive input network resembles a classical voltage divider, in that it has two sections that are in series. In a classical voltage divider the input voltage is applied to one end while ground is at the other, with the divided output taken somewhere between, and is applied to some very high resistance measurement element, such as a FET or the grid of a tube. In a modern DMM the input is at one end of the resistive input network, a feedback voltage from an input amplifier that inverts its input is at the other, and a virtual ground is maintained at the division node (which is also the input to the input amplifier). The signal to be measured by the ADC is essentially the feedback voltage. It is fair to call this resistive network a voltage divider, since it is still a series combination of two resistances of a selected ratio, and the voltage drops across them will be in accordance therewith. It just so happens that it is part of a larger servo arrangement that keeps the voltage at the junction (the virtual ground) very near zero volts. We shall be content to refer to the resistive input network as simply a voltage divider.

The resulting ADC reading is then multiplied by a suitable scale factor (and perhaps otherwise processed) before being displayed as the DMM's result. The accuracy of the result then depends not only on the ADC, but also upon the voltage divider. This DC voltage divider often has a very high overall resistance, so as to maintain a suitably high input resistance for DC measurements.

Many DMMs also measure AC voltages in addition to DC, and do so using the same basic architecture, although the circuitry used might well be a different instance of that architecture. The need for a precision input voltage divider remains, as in the DC case, although the degree of precision is sometimes relaxed, owing to the difficulty in making precision AC measurements: the virtual ground now has to be an AC virtual ground, with everything that requires in terms of amplifier performance as a function of frequency. If one could be assured that the divider were entirely resistive, then things would be considerably easier. As it is, however, the designer has to contend with stray capacitances that variously shunt the resistive elements in the voltage divider. These strays exist across the resistive elements themselves, as well as exist from various nodes in the divider to other places, such as actual ground. At higher frequencies the decreasing capacitive reactances of the stray capacitances shunt the resistive elements and seriously disturb the division ratio, and thus destroy the accuracy of the measurement. The conventional method of coping with this situation is to add an additional capacitive voltage divider in parallel with the resistive one, with the corresponding nodes connected. That is, make a divider out of parallel RC sections that are connected in series. The RC time constants are all equal, and the added C's swamp out the strays. This type of structure is generally known as a compensated AC attenuator. The price paid is that the input impedance at high frequencies is now much less than before, although not so much as to become a serious issue.

In fact, while input resistances of 10 MΩ or (much!) higher are common for DC DMMs, a considerably lower value is often acceptable for AC measurements. A more important aspect of AC measurements is the flatness, or constancy, of the division ratio throughout a specified range of frequencies. As it turns out, capacitors are complex structures in their own right, and the effective ratio of a large capacitance to a smaller one may not stay the same over a wide range of frequencies. For example, they may have different dissipation factors. So, there is a limit, imposed by capacitor performance, to the extent that a resistive divider can be turned into a precision compensated AC attenuator. One way to reduce the need for additional capacitance in the attenuator is to use, for AC measurements, a different attenuator whose input resistance to the virtual ground is much lower, say, 1 MΩ. Such a lower value of resistance is less easily shunted by the stray capacitances, and a smaller added capacitance can be used to achieve compensation. This lesser need for compensatory capacitance eases the frequency response problem caused by capacitor performance (i.e., the capacitive divider's division ratio being a function of frequency as the different capacitors behave differently as frequency changes), but does not eliminate it entirely. The issue returns as the accuracy of the measurement increases. If the stray capacitances are swamped out, then performance issues in the additional compensatory capacitors become an issue, whereas if the strays are ignored, then even with reduced resistances those strays eventually become an issue, anyway, as frequency gets high enough. Thus, it seems that we are presented with a dilemma.

Now consider an input network for a precision AC voltage measurement of up to 1KV for frequencies of up to 1 MHZ. It should be not too big, not too expensive and of very flat frequency response, say to about 0.01%, while also being easy to trim (make minor adjustments for compensation) to maintain that flatness after installation in an actual circuit during manufacture. That is quite a wish list, and not easily achieved (the afore-mentioned dilemma) while using individual parts to form a conventional compensated attenuator. What to do?

SUMMARY OF THE INVENTION

A precision high voltage AC input voltage divider is obtained by producing on a substrate by thin film techniques a precision resistive voltage divider. It comprises a 1MΩ input resistor in series with a 2KΩ feedback resistor, and is packaged as a three terminal part whose connections are for input, feedback and virtual ground. The 2KΩ resistor is formed from a bulk region of resistive material printed on the substrate. The 1MΩ resistor is printed as a serpentine pattern for a thin line of resistive material. Some loops of the serpentine are initially shorted out by removable printed links, to allow the value of the 1MΩ resistor to be laser trimmed after manufacture, but before installation in a DMM. There still exist bothersome original "bad" stray capacitances, particularly those to or from the middle of the serpentine and an actual ground. Rather than swamp them out by conventional compensation capacitors that carry current flowing through the virtual ground, the original bad stray capacitances are effectively removed by coupling to their ungrounded ends additional "good" stray capacitances that are themselves driven by the input voltage. The additional good stray capacitances are chosen to supply substantially the exact current needed by the original (bad) strays (i.e., current flowing through the resistors never enters the strays), so that the original resistive divider never "sees" the strays at all, and requires in addition only minimal conventional compensation by external parts. The additional good strays are obtained by a metallic conductor that starts at (and is electrically connected to) the input terminal, and runs adjacent to the serpentine resistance for part or all of its length. The stray capacitances associated with the feedback resistor may be effectively removed by a corresponding second conductor driven by the feedback voltage.

DESCRIPTION OF A PREFERRED EMBODIMENT

Figure 1:
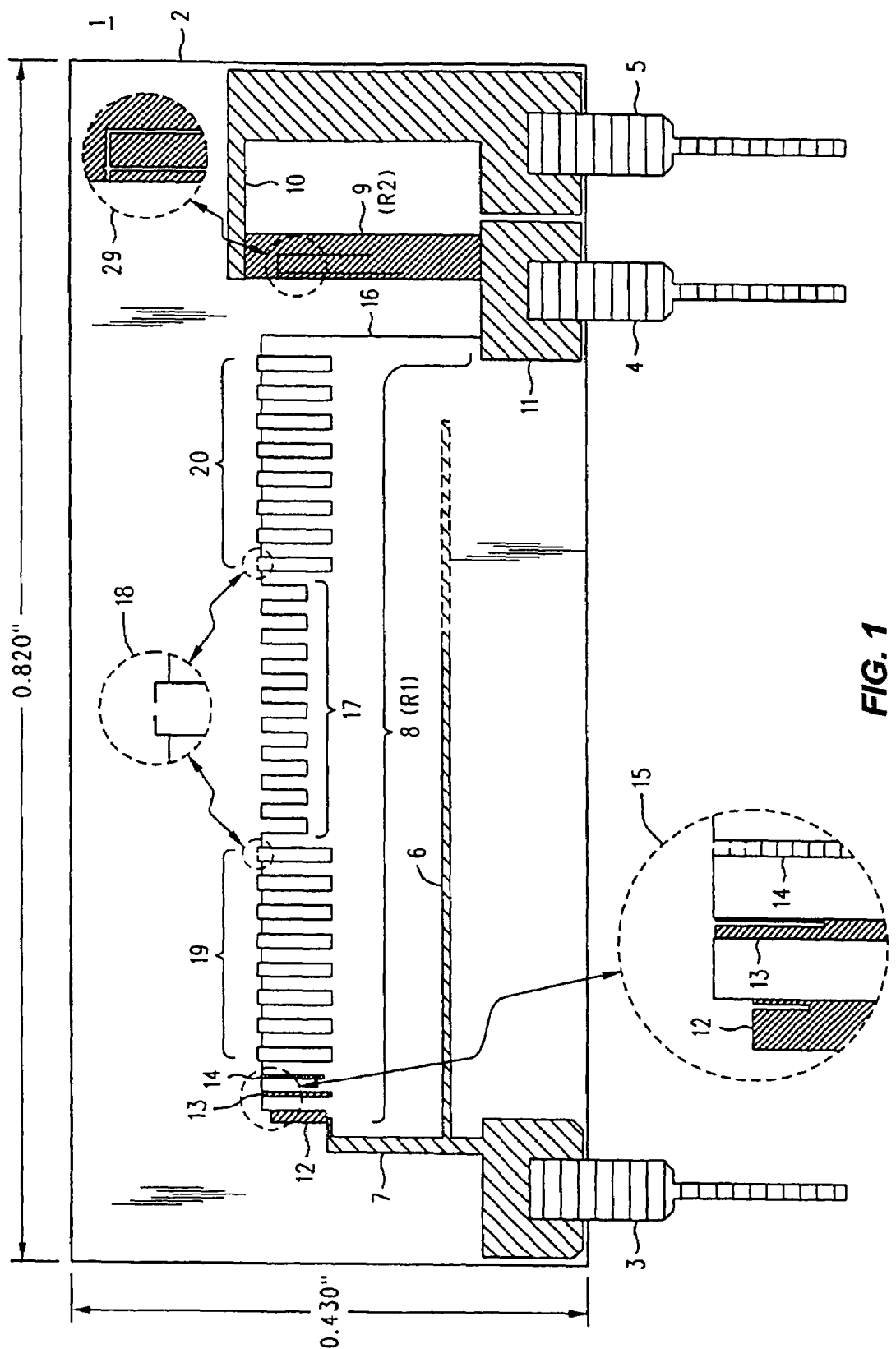
FIG. 1 is a simplified pictorial view of an AC voltage divider fabricated in accordance with the principles of the invention.

Refer now to FIG. 1, wherein is shown a simplified pictorial representation 1 of a precision AC voltage divider (8, 9) fabricated upon a substrate 2, which may be of alumina. The voltage divider is a three terminal device, and those terminals are an input terminal 3 for application of an input AC voltage (although DC voltages are readily divided as well), an intermediate terminal 4 that will serve both as the junction of the two resistances (R1 & R2) that constitute the voltage divider and additionally as a virtual ground maintained at an inverting amplifier's input, and, a feedback terminal 5 receiving the inverting amplifier's output. (That output also serves as the quantity to be measured by an ADC. Neither the amplifier nor the ADC are shown in this figure).

Figure 2:
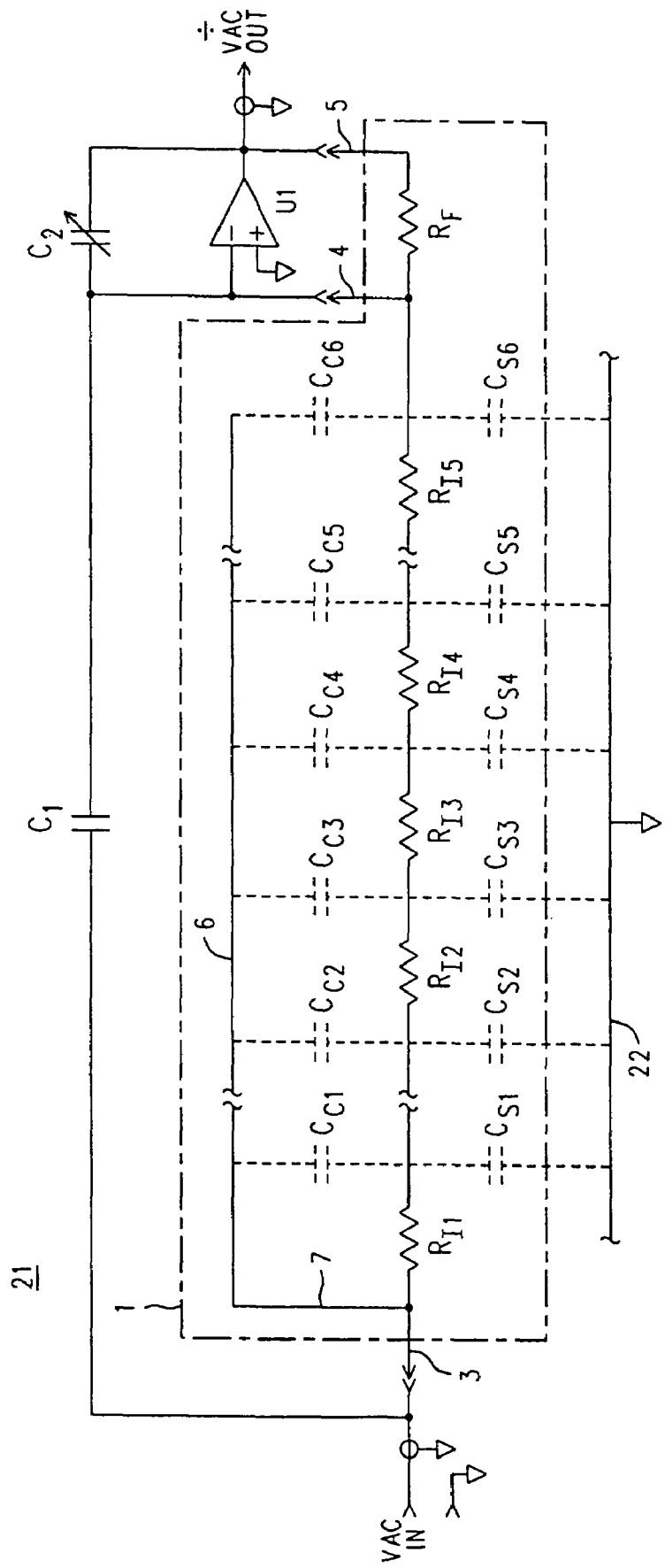
FIG. 2 is a simplified schematic of a particular application of the AC voltage divider of FIG. 1 in a DMM's input circuit.

The example of FIG. 1 is a 500:1 voltage divider, when used in the circuit configuration shown in FIG. 2. To that end it has formed upon it a precision 1MΩ resistance 8 (shortly to be discussed in detail) and a precision 2KΩ resistance 9. The resistances 8 and 9 are printed on the substrate using conventional thin film techniques, and it will be appreciated that thick film techniques may be applicable, as well, depending on the application. With regard to the thin film example under consideration, the resistive material is 250 Ω/sq. nickel chromium. The 2KΩ resistor 9 (R2) is printed as a wide strip of material that is shown as densely shaded and that runs between printed gold conductors 10 and 11 that also connect to terminals 5 and 4, respectively. The 1MΩ resistor 8 (R1) is formed largely of a serpentine pattern of a line 0.0005" in width, and that is shown simply as a line 16.

(A serpentine pattern for the resistor is not the first choice of pattern, especially for AC use: a straight line would be preferable. However, there is a limit to how much space can be devoted to the substrate and to how many ohms per square are available. In our case the length of the resistive line needed for 1MΩ exceeded the width of the selected substrate, so a serpentine pattern was used for the 1MΩ resistor R1 (8).) A portion of that line (16) connects to terminal 4 via gold conductor pad 11, while the other portion becomes (going to the left) serpentine regions 20, 17 and 19. Continuing further left the line becomes adjustment ladder 14, and then adjustable strips 13 and 12. The distal end of adjustable strip 12 connects to a gold conductor 7 that in turn becomes a pad that carries the input terminal 3.

Region 17 is the central portion of the resistor 8, and typically accounts for the majority of its resistance. To minimize the effects of stray capacitance between parallel conductors within the serpentine, the spacing between the serpentine bends (in all of resistor 8, not just region 17) has been made a large as possible for the substrate's size. That spacing is 0.012". In addition, the length of those parallel conductors in the serpentine (the "depth" of the serpentine bends) has been kept to a minimum, again, to minimize the stray capacitance across the bends.

The nature of the serpentine regions 19 and 20 may be appreciated with the aid of the inset 18. It shows that "shorting links" at the tops of the serpentine loops in regions 19 and 20 may be selectively opened by a laser during manufacture to add length to resistor 8, and thus increase its value. The removal of such shorting links is a coarse adjustment, and it is preferred that as link removal is performed, links are removed alternately from regions 19 and 20, and from region 17 outward.

Ladder region 14 is a medium adjustment to the resistance of resistor 8. As can be more easily seen in the inset 15, length can be added to the resistor 8 by removing consecutive top-most "rungs" of the "ladder" 14. Similarly, regions 13 and 12 (which are wide enough to be shown as densely shaded regions) may be slit from above by laser trimming to add resistance to resistor 8. Region 13 constitutes a fine adjustment, while region 12 constitutes a very fine adjustment. Using these adjustments the value of R1 (8) can be adjusted to within one percent of the desired 1MΩ.

R2 (9) is similarly adjustable by laser trimming during manufacture, as shown in the inset 29. Thus, not only can the ratio of the two resistors R1 and R2 be controlled, but their particular values, as well.

Once the voltage divider assembly 1 has been adjusted, it is given a protective coating of Mylar emulsion.

Now note conductor 6, which extends from conductor 7 (i.e., from the input terminal 3) and runs adjacent to the resistor 8. In this example it runs parallel to resistor 8, and for perhaps two thirds of the way across its length. It might, in other embodiments, run further to the right, as indicated by the dotted line extent of conductor 6. It might also not run parallel, but at an angle, it need not necessarily be on the bottom, but could be on the top, instead, or there might be such a conductor (6) at both the top and the bottom. These variations in embodiment will be discussed in connection with FIG. 3. It is sufficient at present to take note of the physical location of the particular instance of conductor 6 shown in FIG. 1, with an eye toward its electrical significance and consequences.

We have shown a resistor R1 (8) that is formed of a serpentine. That is a convenient way to add length, and thus resistance. It will be appreciated that 1KV across 1MΩ is one watt, so the ability of the resistance material to dissipate heat per unit of length is also a consideration. The ability to dissipate the one watt is enhanced by the thermal conductivity of the substrate 2, and it may, in some embodiments, be desirable to have a heat sink on the back side of the substrate. The presence of such a heat sink can be expected to alter the nature of the stray capacitances, and thus may have a bearing on the location and shape of the conductor 6, as will be appreciated from the explanation that follows. It will also be appreciated that the resistor R1 (8) might have a shape other than a serpentine.

Now refer to the simplified schematic 21 of FIG. 2. It is an AC voltage input circuit for a modern DMM. The long/short dashed line indicates the components that are part of the resistive divider assembly 1 of FIG. 1. As mentioned, terminal 3 receives an AC input voltage, terminal 4 is an input to an inverting amplifier U1, whose output is connected to terminal 5 to drive a feedback resistor ($R_F$) and thus maintain terminal 4 as a virtual ground.

Note that the input resistance ($R_I$) between terminals 3 and 4 (which is R1 in FIG. 1) has been partitioned into an equivalent series collection: $R_{I1}$ ... $R_{I2}$, $R_{I3}$, $R_{I4}$ and $R_{I5}$. However tempting it is to construe these various $R_I$ as corresponding to the loops of the serpentine, it is better if that temptation is resisted! It is more that we have the problem of depicting stray capacitances to actual ground (22) that are to or from the distributed length along $R_I$, and have chosen to depict an equivalent circuit of discrete components. Naturally, the number of components is not an issue, save to say that the more the better, and we have, for practical reasons shown only a few in the figure.

Let us temporarily ignore any stray capacitances to actual ground (the $C_{Si}$), say, we pretend that there aren't any. There would still be an end-to-end capacitance across $R_I$, perhaps made worse by the serpentine nature of $R_I$, but still there even if $R_I$ were a straight line of resistive material. (To avoid cluttering the figure, we have not shown any capacitances in parallel with the $R_{Ii}$, or their equivalent end-to-end replacement.) That collection of stray end-to-end capacitances would be equivalent to a capacitor such as $C_1$, and although its value would be fairly small, it cannot be simply ignored. What that means is that the resistive divider of $R_I/R_F$ needs genuine compensation if it is to be used in AC service. That is why $C_1$ and $C_2$ are included in the circuit 21. In one preferred embodiment, C1 is an actual external capacitor that combines with the equivalent end-to-end stray capacitance across RI, and cooperates with variable trimmer capacitor $C_2$ to provide (conventional) compensation.

It should be noted that even though we assume that the stray C to ground (the $C_{Si}$) can be ignored (that will the job of conductor 6, as explained below), we do not assert that conductor 6 eliminates that end-to-end stray C! However, since the stray C to ground elimination mechanism makes those stray capacitances to ground vanish, or very nearly so, $C_1$ can now be much small than before, since it no longer needs to swamp out those strays to ground. (The lower limit is set by the end-to-end stays, and there are issues related to tolerances.) A small $C_1$ means a smaller than otherwise $C_2$ (but likely still larger than $C_1$, since $R_F$ is probably less than $R_I$ and the RC time constants are to be equal). It is thus much easier to find a $C_1$ and $C_2$ whose effective values track (maintain a given precision ratio) as frequency (and temperature) changes when $C_1$ and $C_2$ are smaller, than when one of them ($C_2$) gets above about, say, 2,000 pF while the other is substantially (say, about $1/500_{th}$) below that. Said another way, keeping the sizes of $C_1$ and $C_2$ low allows the maintenance of a precision capacitance ratio (proper compensation), and thus accuracy, for a larger upper frequency limit and over a wider range of operating conditions.

So, without further ado, consider the those bothersome stray capacitances to actual ground. In FIG. 2 we have indicated them as the dotted line discrete components $C_{S1}$ ... $C_{S2}$, $C_{S3}$, $C_{S4}$, $C_{S5}$ and $C_{S6}$. As with the discrete resistors ($R_{I1}$-$R_{I5}$), the exact number is not an issue, although more is better. It will also be appreciated that it is just a convenience that the number of such stray $C_{Si}$ is related to the number of resistor sections (the $R_{Ii}$). Each of the stray $C_{Si}$ is depicted as being from some point along the input resistor R1 (8 in FIG. 1) to actual ground.

Now, if we ignore the effects of conductor 6 and its associated "good" strays (the $C_{Ci}$), then it is clear that the distributed "bad" strays (the $C_{Si}$) combine with the distributed resistance along the length of R1 to form a distributed low pass filter. If not dealt with, this filter would severely disturb the flatness with respect to frequency of the voltage divider (R1/R2 in FIG. 1, $R_I/R_F$ in FIG. 2). Of course, we could swamp out the effects of this distributed low pass filter by making the values of $C_1$ and $C_2$ disgustingly large, but at the expense of losing THEIR precision ratio as a function of frequency.

Instead, we deposit conductor 6 on the substrate, thus forming the various "good" stray capacitances $C_{C1}$-$C_{C6}$, and drive them all with the input voltage by connecting conductor 6 to the input terminal 3. Now, just as it was convenient to show a number of "bad" stray Cs that appeared related to the number of segments in the resistor $R_I$, we find it convenient to arrange (or re-arrange) things so that the number of "good" strays appears to be in correspondence with the "bad" strays. (This is a useful explanatory device, but the wise reader will keep it firmly in mind that the situation shown in FIG. 2 is just a discrete approximation of a rather messy distributed case.)

To continue, then, it will be appreciated that we can adjust (increase) the values of the individual $C_{Ci}$ so that each $C_{Ci}/C_{Si}$ pair forms a voltage divider between the applied VAC IN and actual ground, such that the voltage at the junction of those two stray Cs is exactly, or very nearly so, that which would appear at the corresponding location along RI, if there were no stray Cs. That is, that the various $R_{Ii}$ segments never need to supply current into the associated $C_{Si}$. But it is supplying that current that makes the aforementioned distributed low pass filter. We have removed that low pass filter! On the other hand, we don't want to overdo it, lest the $C_{Ci}$ be too large and the $C_{Ci}/C_{Si}$ dividers begin to actually drive the $R_{Ii}$. Then the thing would begin to resemble a high pass filter. In the present embodiment we don't want that, either, although one can imagine situations where to do so would be a useful compensatory device in its own right.

In general, we might expect the value of $C_{C1}$ to be larger than $C_{C5}$. That is because there is less of the input voltage left by the time the junction between $R_{I4}$ and $R_{I5}$ is reached, while we expect that, all things otherwise being equal, all of the various $C_{Si}$ are about the same. So there would be less current from the $R_{Ii}$ segments that would flow through $C_{S5}$, than through $C_{S1}$. But $C_{C1}$ and $C_{C5}$ are each driven by the full input voltage, so $C_{C5}$ needs to be lower in value to limit the current to the lesser amount. Likewise, $C_{S1}$ would carry more current because of the greater voltage that it is exposed to, implying that $C_{C1}$ needs to be correspondingly larger to supply that current. On the other hand, the effects of errors in the $C_{Ci}/C_{Si}$ ratio at different points along the $R_{Ii}$ are most acute in the middle of $R_I$. That is because it takes a voltage from the resistor segments to drive the current into the "bad"

strays (and there is more voltage on the left as seen in the figure), while it is the presence of resistance to the left of a "bad" C to ground that forms the low pass filter (and there is more such resistance as the point under consideration moves to the right). The situation is rather like the maximum power transfer hyperbola in resistive networks. So the greatest sensitivity to the values of the $C_{Ci}$ is found in the middle of $R_I$. This probably accounts for our findings in one actual embodiment that a conductor 6 that ran parallel only part way from terminal 3 toward terminal 4 (see FIG. 1, again) was a very good solution. That is, if you get it correct in the middle, then the errors on the ends are second order effects that might safely be ignored, depending of course, on the particular application and the amount of precision required.

Figure 3:
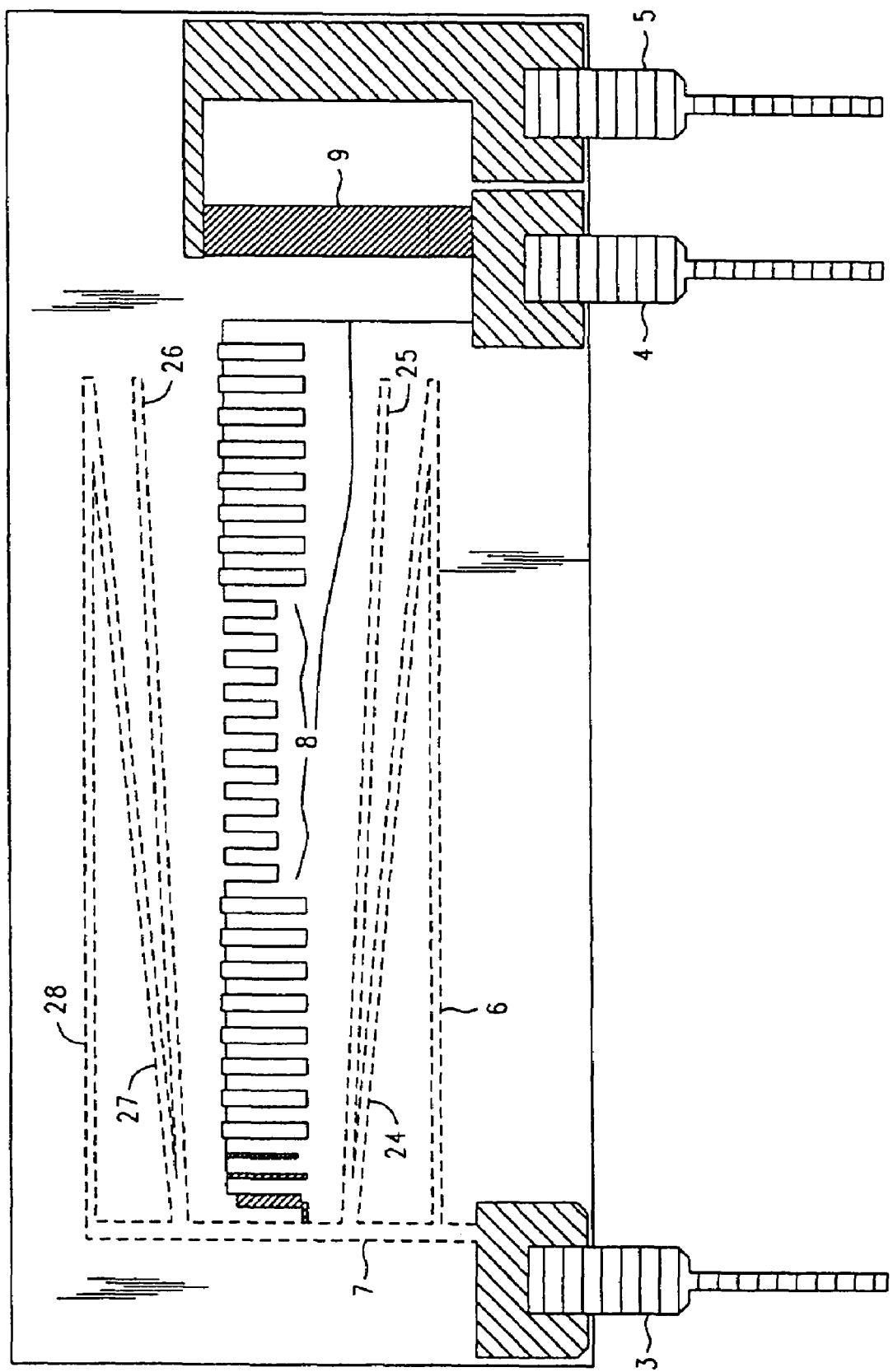
FIG. 3 is a simplified pictorial view showing alternate embodiments of the AC voltage divider of FIG. 1.

Refer now to FIG. 3, wherein is shown some alternate embodiments 23 concerning the location and shape of conductors corresponding to 6 in FIG. 1. Thus, there are shown not just 6, but also 24-28. Taken together, they represent instances of a conductor like 6 that proceed more or less of the way from terminal 3 to terminal 4, are located above or below, or on both sides of, resistor 8, and run parallel to it or at an angle. The angles we show would tend to create decreasing $C_{Si}$ at locations further from terminal 3 and closer to terminal 4. This is reasonable for the application we have described, but we admit that there may be an application where the conductor might get closer to the resistor 8 at points further from terminal 3 and closer to terminal 4.

Figure 4:
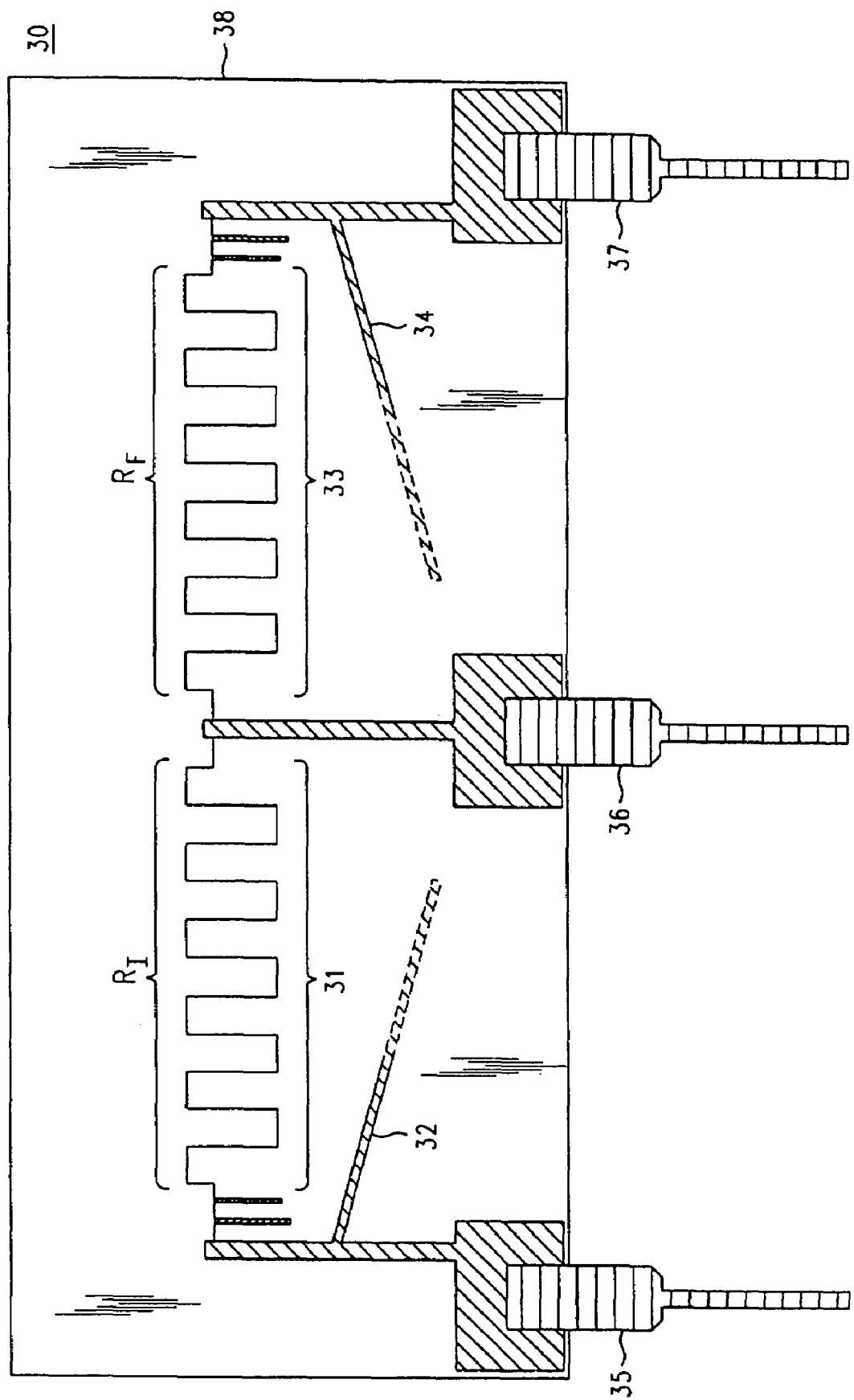
FIG. 4 is a simplified pictorial view of an alternate embodiment similar to that of FIG. 1, but where both resistors are compensated for stray capacitance.

Finally, refer to FIG. 4, wherein is shown yet another alternate embodiment 30. This again is two resistors $R_I$ (31) and $R_F$ (33) formed on a substrate 38. As before, there are three terminals 35, 36 and 37. $R_I$ is between terminals 35 and 36, while $R_F$ is between terminals 36 and 37. This part might operate in a circuit the same as or similar to the one (21) shown in FIG. 2. That is, terminal 36 is a virtual ground, with terminal 35 being an input and terminal 37 being for feedback. Conductor 32 corresponds to conductor 6 in FIGS. 1 and 2, and nullifies stray C to actual ground to/from $R_I$ 31. Notice that in this embodiment the stray capacitances to actual ground for $R_F$ are also made to vanish by action of conductor 34 and the "good" stray capacitances (not shown) between conductor 34 and the resistor $R_F$ 33.

Lastly, we have shown circuit arrangements of interest to the operational amplifier front end of modern DMMs. It will be appreciated that other circuits, such as integrators, oscillators or other coupling networks may use the distributed coupling mechanism of FIGS. 1, 3 and 4 to advantage. Also, there is not, in principle, any reason why the theory of why it works would limit application to printed resistors on a substrate. It would work just as well with regular leaded components carried on a circuit board or upon stand-offs.

We claim:

1. A resistive voltage divider comprising:
   an insulating substrate;
   a first terminal for application of an input voltage;
   a second terminal;
   a third terminal;
   a first resistor formed on the insulating substrate and connected between the first and second terminals;
   a second resistor formed on the insulating substrate and connected between the second and third terminals;
   a first metallic conductor formed on the insulating substrate, connected at one end to the first terminal, disposed to be adjacent to at least part of the first resistor and having a distributed capacitive coupling to the first resistor that is selected to compensate for distributed stray capacitance from the first resistor to a circuit ground; and
   a second metallic conductor formed on the insulating substrate, connected at one end to the third terminal, disposed to be adjacent to at least part of the second resistor and having a distributed capacitive coupling to the second resistor that is selected to compensate for distributed stray capacitance from the second resistor to the circuit ground.

2. A resistive voltage divider as in claim 1 wherein the insulating substrate is ceramic and the first and second resistors are serpentine patterns of nickel chromium.

* * * * *